(12) United States Patent
Gao (10) Patent No.: US 11,889,664 B2
(45) Date of Patent: Jan. 30, 2024

(54) THERMAL MANAGEMENT SYSTEM WITH PHASE CHANGE AND AUXILIARY COOLING SYSTEMS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 178 days.

(21) Appl. No.: 17/356,888

(22) Filed: Jun. 24, 2021

(65) Prior Publication Data

US 2022/0418168 A1 Dec. 29, 2022

(51) Int. Cl.
*H05K 7/20* (2006.01)

(52) U.S. Cl.
CPC ..... *H05K 7/20836* (2013.01); *H05K 7/20318* (2013.01); *H05K 7/20327* (2013.01); *H05K 7/20827* (2013.01); *H05K 2201/10151* (2013.01); *H05K 2201/10219* (2013.01)

(58) Field of Classification Search
CPC .......... H05K 7/20836; H05K 7/20827; H05K 2201/10219; H05K 7/20772; H05K 7/20809; H05K 7/208; H05K 7/20709; H05K 7/20763
See application file for complete search history.

(56) References Cited

U.S. PATENT DOCUMENTS

| 7,903,409 | B2 * | 3/2011 | Patel | ...................... | G06F 1/206 |
| | | | | | 174/547 |
| 9,027,360 | B2 * | 5/2015 | Chainer | ............. | H05K 7/20781 |
| | | | | | 62/3.2 |

* cited by examiner

*Primary Examiner* — Lionel Nouketcha
(74) *Attorney, Agent, or Firm* — WOMBLE BOND DICKINSON (US) LLP (57) ABSTRACT

A thermal management system includes a cooling unit, a condenser, and a processor. The processor is located within a server, and the system also includes a phase change cooling device in thermal communication with the processor, and in fluid communication with the condenser. The system also includes a single phase cooling device in thermal communication with the phase change cooling device, and in fluid communication with the liquid cooling unit. The system also includes a temperature sensor in thermal communication with the single phase cooling device, and a fluid pump to move fluid between the liquid cooling unit and the single phase cooling device. A TEC device may also be implemented between the phase change cooling device and the single phase cooling device.

10 Claims, 6 Drawing Sheets

The phase change system functions as primary cooling system, and each phase change plate/plates within one server is designed with an individual independent condenser
501

The TEC systems and the liquid pump systems are designed as auxiliary systems, and both systems are controlled by the temperature sensor fabricated within the cooling device
503

The sensor may control the power source to the TEC through BMC. When sensor temperature increases to design threshold, then TEC functions as heat pump
505

The temperature sensor is also used for controlling the single phase system. The single phase system is designed as one central unit, and any of the individual temperature sensors may trigger the pump to turn on or control the operation of each of the single phase cooling devices.
507

The pump speed can be gradually increased based on the number of temperature sensors which exceed the design threshold
509

THERMAL MANAGEMENT SYSTEM WITH PHASE CHANGE AND AUXILIARY COOLING SYSTEMS

FIELD OF THE DISCLOSURE

Embodiments of the present invention relate generally to server and electronic cooling systems. More particularly, embodiments of the invention relate to a cooling system with a phase change and auxiliary cooling system.

BACKGROUND

Electronics cooling is an important market for computing hardware and other electronic devices, such as CPU servers, GPU servers, storage servers, networking equipment, edge and mobile systems, on-vehicle computing boxes and so on. Cooling of these electronics becomes more and more challenge to ensure they function properly by constantly providing designed thermal environments. Previous solutions for cooling electronics components do not include auxiliary or redundant cooling systems and may not be able to handle failure of the cooling module. In addition, the previous solutions may require complex system architecture in order to enable a redundant design.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

Embodiments described herein provide for a redundant cooling system that includes multiple independent cooling devices. The solution disclosed herein significantly increases the device fabrication efficiency, and provides flexibility to be used in different system cooling architectures using different cooling fluids.

According to some embodiments, the techniques disclosed herein provide an advanced solution for critical processors to solve a number of non-trivial challenges. These advantages include: high power density thermal management for critical processors, redundancy on the cooling module level, high system reliability, lower dependency on system control or sensors, ease of installation and service, and compatibility with different system/facility infrastructures and cooling fluids.

Electronics cooling is an important market, since it is a fundamental technology for new chips and electronics, and it provides a basic thermal environment for proper design and operation. It is seen that thermal management is becoming more and more critical for high performance processors. As computing hardware and processors become more and more expensive, cooling reliability is critical to prevent any potential damage to expensive components, while at the same time, maintaining the proper thermal operation environment for the ever increasing power density of the chips. Designing a full redundant solution without may single failure port is challenging and critical.

In an embodiment, the present disclosure includes a phase change cooling system directly implemented on the processors for dissipating heat during normal operation. The cooling device disclosed herein includes an auxiliary single phase cooling system in addition to the phase change cooling system. In one embodiment, the cooling device disclosed herein also includes a TEC device packaged on top of the phase change system to function as one of the auxiliary systems. On top of the TEC device, a single phase cooling system can be implemented, thus providing a second auxiliary cooling system. The phase change system for each of the servers can be implemented with an individual independent condenser, and the TEC device can be individually connected to the server PCB as a DC power source. The single phase system can be designed for multiple servers within a rack. In one embodiment, the entire rack may be designed with one single phase system using one fluid pump to pump liquid coolant to each individual single phase cooling device for each server. Individual temperature sensors can be packaged within the cooling plate or cooling unit to control the pump, as well as to control the TEC system power through a BMC.

System Overview

Figure 1:
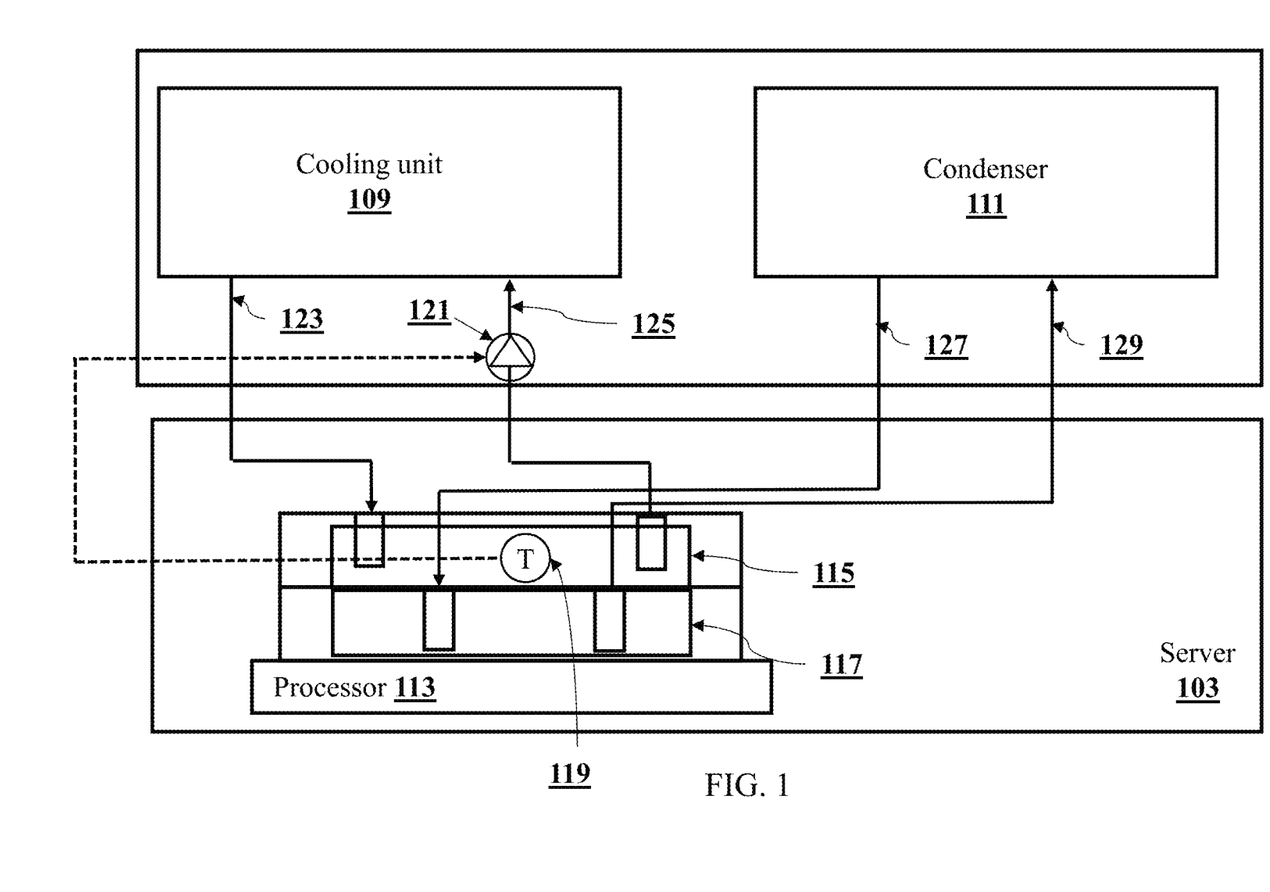
FIG. 1 shows a block diagram of a thermal management system with a phase change system and an auxiliary system, according to an embodiment of the present disclosure.

FIG. 1 shows a block diagram of a thermal management system with a phase change system and an auxiliary system, according to an embodiment of the present disclosure. In this embodiment, a processor 113 within a server 103 is cooled using a primary phase change cooling device 117 and a secondary or auxiliary single phase cooling device 115. The phase change cooling device 117 is provided with fluid via a condenser 111, a fluid supply 127, and a vapor return 129 for returning vaporized or partially vaporized fluid back to the condenser 111. Similarly, the single phase cooling device 115 is provided with liquid via a cooling unit 109, a liquid supply 123, and a liquid return 125. In this embodiment, individual systems with independent flow paths are designed for each of the phase change cooling device 117 and the single phase cooling device 115. A temperature sensor 119 can be packaged within the cooling device. In this embodiment, the temperature sensor 119 is located at the single phase cooling device 115, and may also be located at a junction between the phase change cooling device 117 and the single phase cooling device 115, or any suitable location in thermal communication with the single phase cooling device 115 and/or the phase change cooling device 117. The temperature sensor 119 in this embodiment is connected to the fluid pump 121 in order to control the fluid flow, and thus control the operation of the single phase system.

In one embodiment, the phase change cooling device 117 can operate as the primary cooling device for the processor 113, while the single phase cooling device 115 acts as an auxiliary or backup cooling device. If the temperature detected at the temperature sensor 119 increases beyond a certain threshold value, where increased cooling is required, the fluid pump 121 can be activated in order to operate the single phase cooling device 115 in conjunction with the phase change cooling device 117.

Figure 2:
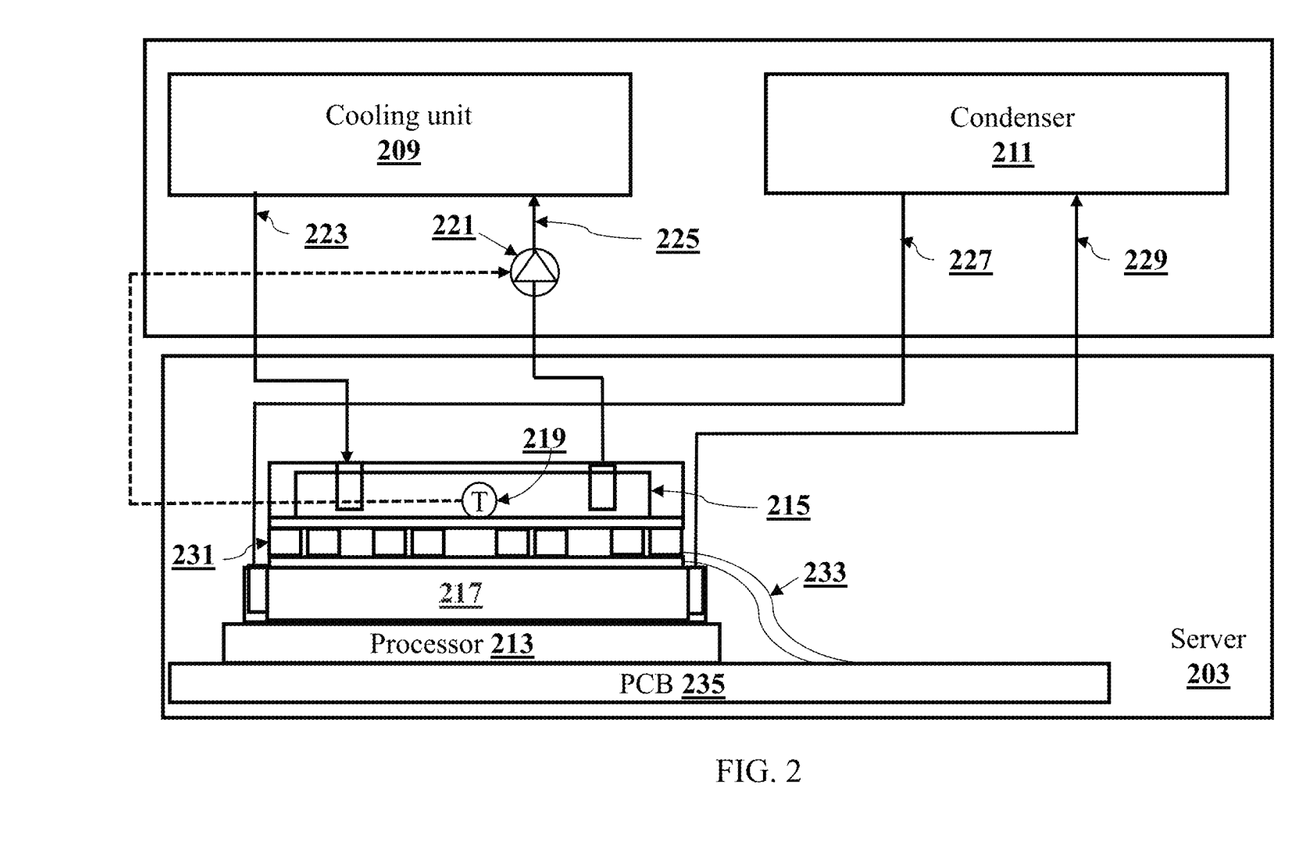
FIG. 2 shows a block diagram of a thermal management system with a thermoelectric cooling (TEC) device, according to an embodiment of the present disclosure.

FIG. 2 shows a block diagram of a thermal management system with a thermoelectric cooling (TEC) device, according to an embodiment of the present disclosure. In this embodiment, a processor 213 within a server 203 is cooled using a primary phase change cooling device 217, a TEC device 231, and a single phase cooling device 215. The phase change cooling device 217 is provided with fluid via a condenser 211, a fluid supply 227, and a vapor return 229 for returning vaporized or partially vaporized fluid back to the condenser 211. Similarly, the single phase cooling device 215 is provided with liquid via a cooling unit 209, a liquid supply 223, and a liquid return 225. In this embodiment, individual systems with independent flow paths are designed for the phase change cooling device 217 and the single phase cooling device 215. The TEC device 231 is located between the phase change cooling device 217 and the single phase cooling device 215, and enables thermal transportation between the two devices, such as transporting the heat from the two phase device to the single phase device.

In this embodiment, a temperature sensor 219 is located at the single phase cooling device 215, and may be located at a junction between the TEC device 231 and the single phase cooling device 215. The temperature sensor 219 in this embodiment is connected to the fluid pump 221 in order to control the fluid flow, and thus control the operation of the single phase cooling device 215. The TEC device is connected to the PCB 235 with electrical wires 233, in this embodiment.

In one embodiment, the phase change cooling device 217 operates as a primary cooling device for the processor 213, and the TEC device 231 and the single phase cooling device 215 can be selectively activated in order to provide additional cooling depending on the temperature measured at the temperature sensor 219. A higher temperature reading from 219 represents insufficient heat extracted by the two phase layer, and the processor may be in a high temperature state.

Figure 3:
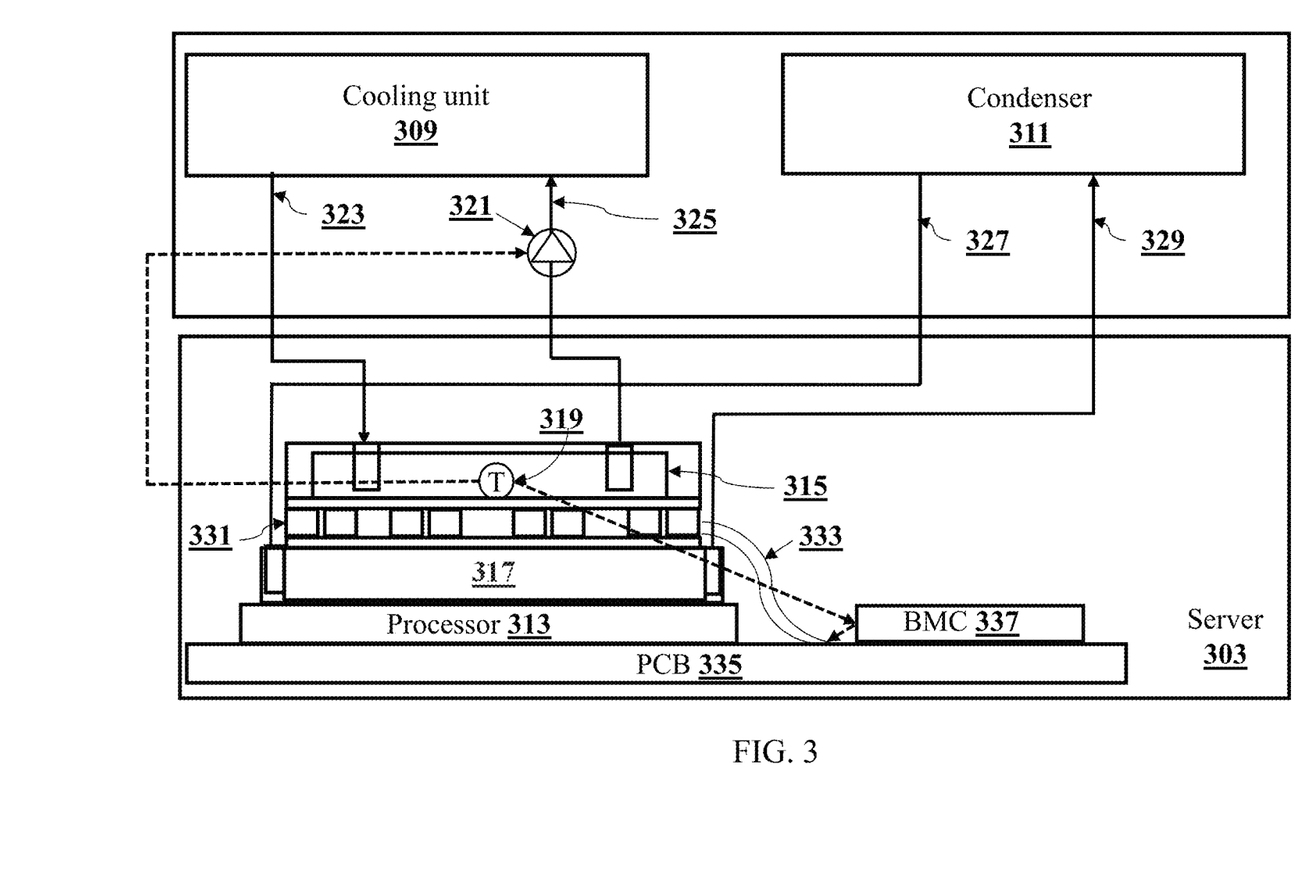
FIG. 3 shows a block diagram of another thermal management system with a baseboard management controller (BMC), according to an embodiment of the present disclosure.

FIG. 3 shows a block diagram of another thermal management system with a baseboard management controller (BMC), according to an embodiment of the present disclosure. In this embodiment, a processor 313 within a server 303 is cooled using a phase change cooling device 317, a TEC device 331, and a single phase cooling device 315. The phase change cooling device 317 is provided with fluid via a condenser 311, a fluid supply 327, and a vapor return 329 for returning vaporized or partially vaporized fluid back to the condenser 211. Similarly, the single phase cooling device 315 is provided with liquid via a cooling unit 309, a liquid supply 323, and a liquid return 325. In this embodiment, individual systems with independent flow paths are designed for the phase change cooling device 317 and the single phase cooling device 315. The TEC device 331 is located between the phase change cooling device 317 and the single phase cooling device 315, and enables thermal transportation between the two devices. The TEC device 331 is also connected to the PCB 335 via electrical wires 333. If the power source delivered to the TEC is adjusted, with higher current delivered, the TEC pumps more heat from one side to the other side.

In this embodiment, a temperature sensor 319 is located at the single phase cooling device 215, and may be located at a junction between the TEC device 331 and the single phase cooling device 315. The temperature sensor 319 in this embodiment is connected to the fluid pump 321 in order to control the fluid flow, and thus control the operation of the single phase cooling device 315. The temperature sensor 319 may also be connected to the BMC 337, such that the operation of the TEC device 331 can also be controlled based on the temperature detected at the temperature sensor 319.

In one embodiment, the phase change cooling device 317 operates as a primary cooling device for the processor 313, and the TEC device 331 and the single phase cooling device 315 can be selectively activated in order to provide additional cooling depending on the temperature measured at the temperature sensor 319. For example, if the temperature detected at the temperature sensor 319 increases beyond a certain threshold level, the BMC 337 can detect this temperature and control power to the TEC device 331 in order to activate the TEC device 331 to function as a heat pump. If the temperature continues to increase, the pump 321 may also be activated in order to cool the processor 313 and extract the heat away by the phase change cooling device 317, the TEC device 331, and the single phase cooling device 315. In one embodiment, the PCB 335 includes a power pin and a power switch to control the power to the TEC device 331 using the BMC 337 through firmware design.

Figure 4:
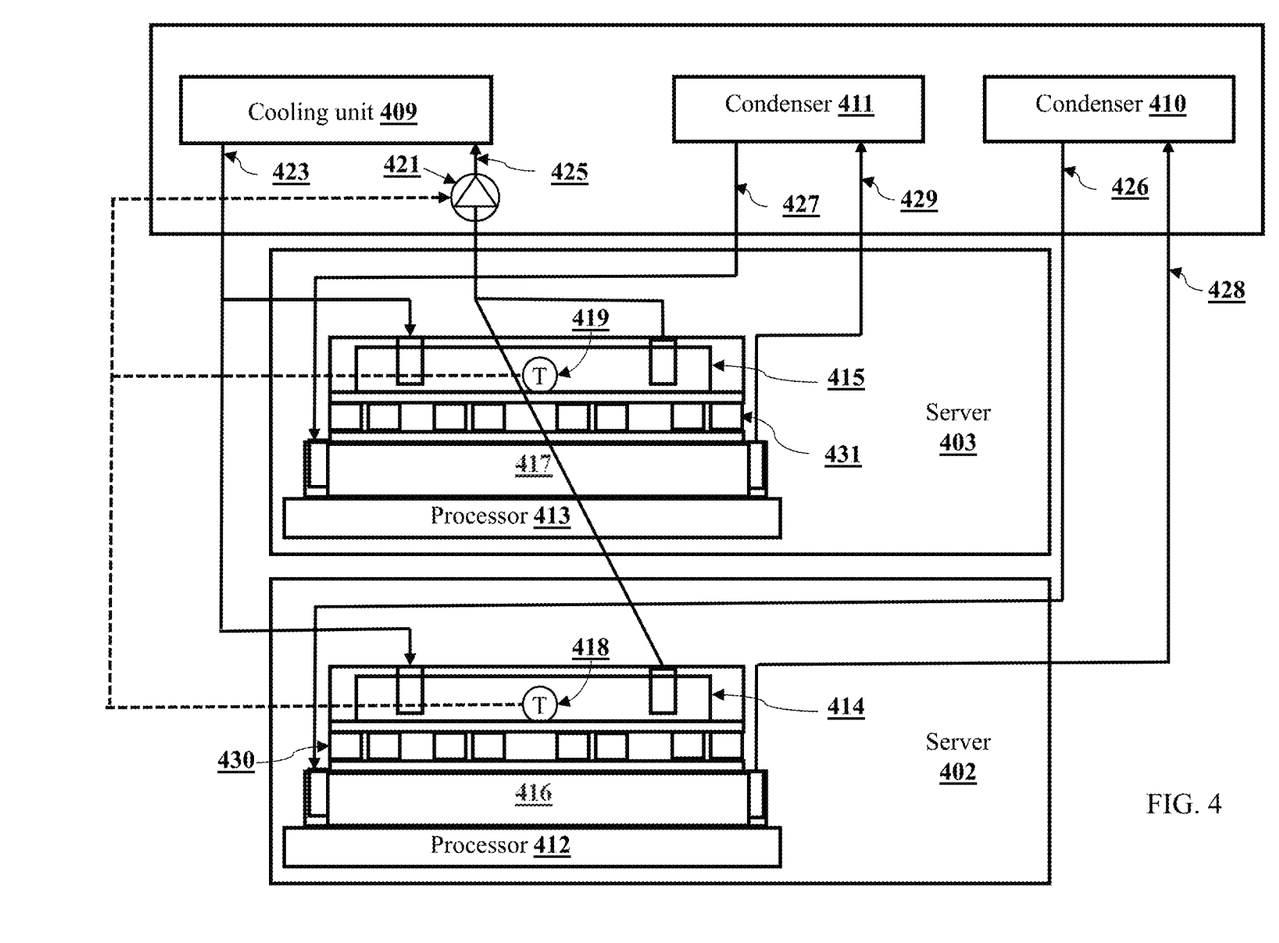
FIG. 4 shows a block diagram of a thermal management system for managing multiple servers, according to an embodiment of the present disclosure.

FIG. 4 shows a block diagram of a thermal management system for managing multiple servers, according to an embodiment of the present disclosure. In this embodiment, the thermal management system includes two servers 402, 403, and each server includes a processor 412, 413, a phase change cooling device 416, 417, a TEC device 430, 431, a single phase cooling device 414, 415, and a temperature sensor 418, 419. Both of the single phase cooling devices 414, 415 are provided with liquid via a single cooling unit 409, a liquid supply 423, a liquid return 425, and a fluid pump 421. In this embodiment, the phase change cooling devices 416, 417 do not share a condenser. The phase change cooling device 417 of server 403 is provided with fluid via a condenser 411, a fluid supply 427, and a vapor return 429; while the phase change cooling device 416 of the other server 402 is provided with fluid via a separate condenser 410, fluid supply 426, and vapor return 428.

In this embodiment, the temperature sensors 418, 419 are located at the single phase cooling devices 414, 415, and may be located at a junction between the TEC devices 430, 431 and the single phase cooling devices 414, 415. The temperature sensors in this embodiment are connected to the fluid pump 421 in order to control the fluid flow, and thus control the operation of the single phase cooling devices 414, 415. Although only two servers 402, 403 are shown in this example embodiment, any number of servers can be thermally managed using the techniques described herein.

In one embodiment, the phase change cooling devices 416, 417 operate as primary cooling devices for the processors 412, 413, and the TEC devices 430, 431 and the single phase cooling devices 414, 415 can be selectively activated in order to provide additional cooling depending on the temperature measured at the temperature sensors. In one example embodiment, if the temperature at any one of the temperature sensors 418, 419 is higher than a particular threshold, the single phase cooling systems for all of the servers can be activated. In response to a higher temperature value detected at the temperature sensors 418, 419, or a greater number of temperature sensors registering a high value, the pump speed or the mode of operation of the fluid pump 421 can be adjusted.

Figure 5:
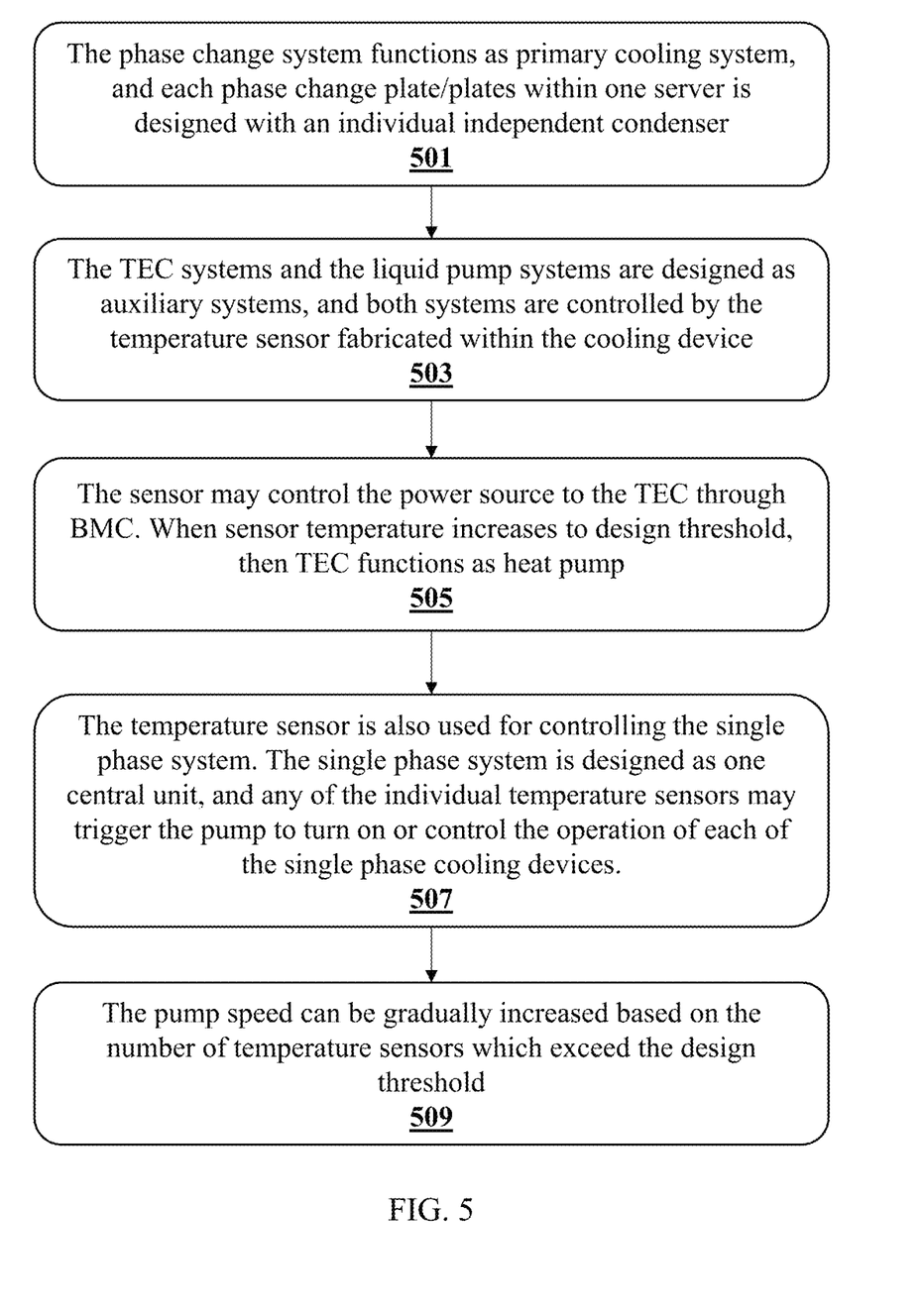
FIG. 5 is a flow chart illustrating an example method of designing and operating a thermal management system, according to an embodiment of the present disclosure.

FIG. 5 is a flow chart illustrating an example method of designing and operating a thermal management system, according to an embodiment of the present disclosure. In operation 501, the phase change cooling systems functions as a primary cooling system. In embodiments where multiple processors are cooled with different phase change plates, each phase change plate can be designed with an individual and independent condenser.

At operation 503, the TEC systems and the liquid pump systems (i.e. the single phase cooling devices), can be designed as auxiliary systems. Although the single phase cooling devices may be considered as auxiliary to the phase change cooling devices, both systems can be controlled by a single temperature sensor fabricated within the cooling device.

At operation 505, the temperature sensor can control the power source to the TEC device using a BMC. When the sensor temperature increases to a particular threshold, the TEC can be activated to function as a heat pump.

At operation 507, the temperature sensor is also used to control the single phase cooling system. In embodiments where multiple processors are cooled by the thermal management system, and multiple temperature sensors are implemented for the multiple processors (as shown in FIG. 4, for example), any of the individual temperature sensors can trigger the pump to activate and operate all of the single phase cooling devices.

At operation 509, the pump speed of the single phase system can be gradually increased based on the number of temperature sensors which exceed a particular design threshold. For example, if a single temperature sensor detects a high temperature, all of the single phase cooling devices can be activated. As additional sensors detect a high temperature, or as the detected temperatures increase, the pump speed associated with the single phase system can increase accordingly.

Figure 6:
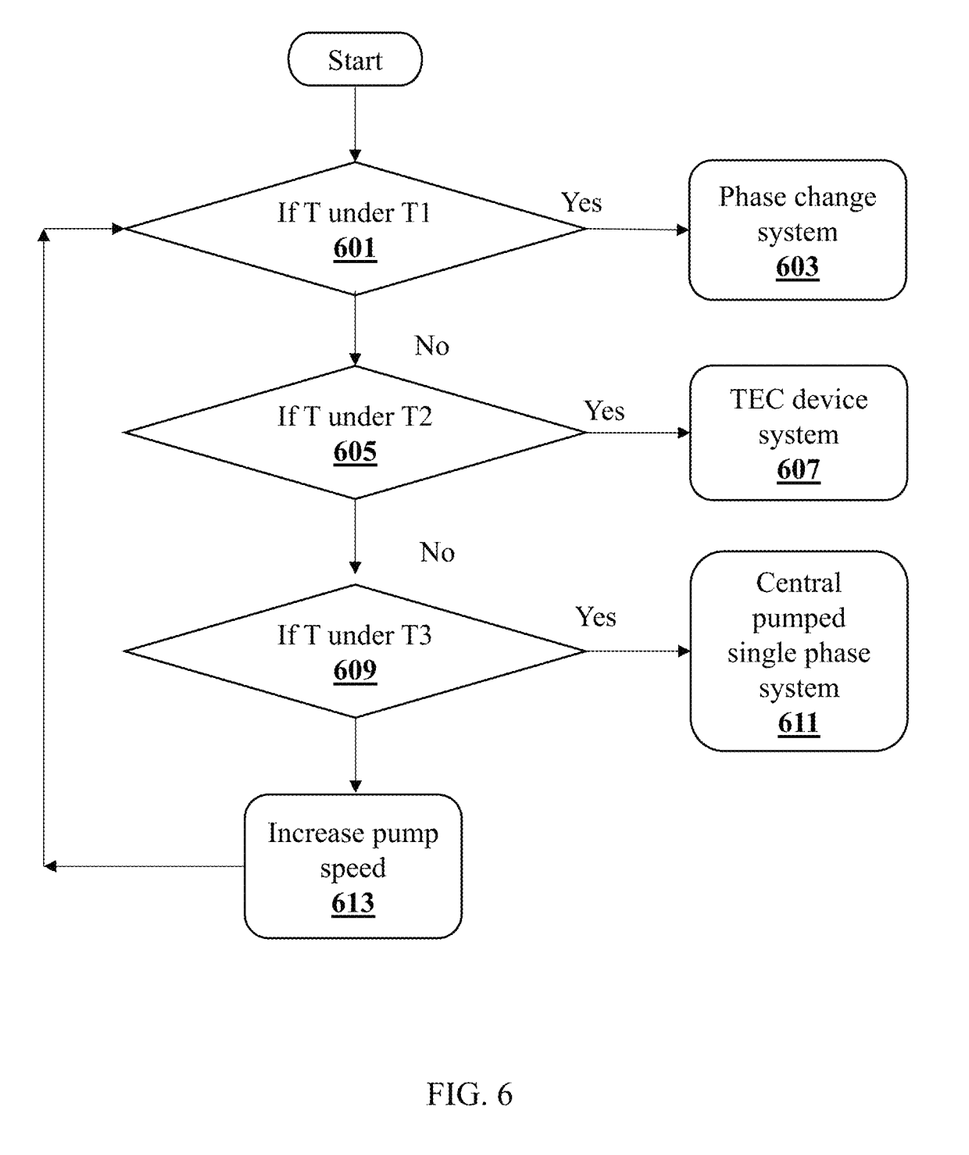
FIG. 6 is a flow chart illustrating an example method of operating a thermal management system, according to an embodiment of the present disclosure.

FIG. 6 is a flow chart illustrating an example method of operating a thermal management system, according to an embodiment of the present disclosure. The method begins at operation 601 with determining whether the temperature detected at the temperature sensor is under a first threshold value T1. If so, the method proceeds to operation 603 and the phase change system operates as the primary cooling method.

If the temperature detected at the sensor is not below T1, the method continues at operation 605 with determining whether the temperature detected at the sensor is below a second threshold value T2. If so, the method proceeds to operation 607, and the TEC device is activated to function as a heat pump in addition to the phase change cooling system. In some embodiments, once the TEC is activated, the upper layer single phase cooling device is also activated. Since the TEC may require cooling to continue extracting heat. The single phase may be kept at a minimum cooling flow rate, and with the T increasing, the flow rate increases as well. In some scenarios, only the TEC is activated for the short period of thermal overshot caused by a short peak power.

If the temperature is not below T2, the method continues at operation 609 with determining if the temperature detected at the sensor is below a third threshold value T3. If so, the method proceeds to operation 611 and activates the central pumped single phase cooling system, in addition to the TEC device and the phase change cooling system. If the temperature is not below T3, the method can continue at operation 613 with increasing the speed of the fluid pump associated with the single phase cooling system.

According to one aspect of the present disclosure, a thermal management system is disclosed. The system includes a liquid cooling unit; a condenser; a processor located within a server; a phase change cooling device in thermal communication with the processor, and in fluid communication with the condenser; a single phase cooling device in thermal communication with the phase change cooling device, and in fluid communication with the liquid cooling unit; a temperature sensor in thermal communication with the single phase cooling device; and a fluid pump to pump fluid between the liquid cooling unit and the single phase cooling device. In one embodiment, the temperature sensor is in communication with the fluid pump such that the fluid pump operates when the temperature sensor has reached a predetermined threshold value. In one embodiment, the system also includes a thermoelectric cooling (TEC) device located between the phase change cooling device and the single phase cooling device. In one embodiment, the phase change cooling device, the TEC device, the temperature sensor, and the single phase cooling device are fabricated as a single package. In one embodiment, the temperature sensor is located between the TEC device and the single phase cooling device. In one embodiment, the system also includes a baseboard management controller (BMC) in communication with the temperature sensor and the TEC device to control power to the TEC device. In one embodiment, both the BMC and the fluid pump are in communication with the temperature sensor to selectively activate the TEC and the fluid pump based on a temperature detected by the temperature sensor. In one embodiment, the system also includes one or more additional servers, each additional server including an additional phase change cooling device, an additional single phase cooling device, and an additional temperature sensor. In one embodiment, the system also includes an additional condenser corresponding to connect to each of the additional servers. In one embodiment, the single phase cooling device of the server, and each single phase cooling device of the additional servers, share the liquid cooling unit.

According to another aspect of the present disclosure, an electronics cooling package is disclosed. The electronics cooling package includes a phase change cooling device; a single phase cooling device; a thermoelectric cooling (TEC) device located between the phase change cooling device and the single phase cooling device to provide thermal communication between the phase change cooling device and the single phase cooling device; and a temperature sensor located near a junction between the TEC device and the single phase cooling device. In one embodiment, the temperature sensor connects to a baseboard management controller (BMC) to control operation of the TEC device. In one embodiment, the temperature sensor connects to a fluid pump to control operation of the single phase cooling device.

According to another aspect of the present disclosure, a method of thermal management within an electronic device is disclosed. The method includes detecting a temperature at an interface between a thermoelectric cooling (TEC) device and a single phase cooling device using a temperature sensor. The TEC device is located between the single phase cooling device and a phase change cooling device, and the phase change cooling device is in thermal contact with a processor within a server. If the temperature detected by the temperature sensor is below a first temperature threshold T1, the method includes operating the phase change cooling device without activating the TEC device or the single phase cooling device. If the temperature detected by the temperature sensor is above T1 and below a second temperature threshold T2, the method includes operating the phase change cooling device and activating the TEC device. If the temperature detected by the temperature sensor is above T2 and below a third temperature threshold T3, the method includes operating the phase change cooling device and activating the TEC device and activating the single phase cooling device. In one embodiment, operating the TEC device includes controlling power to the TEC using a baseboard management controller (BMC) that is in communication with the temperature sensor. In one embodiment, operating the single phase cooling device includes controlling a fluid pump located between the single phase cooling device and a liquid cooling unit. In one embodiment, if the temperature detected by the temperature sensor is above T3, the speed of operation of the fluid pump is increased. In one embodiment, the method also includes detecting an additional temperature within each additional server, with each additional server including an additional phase change cooling device, an additional single phase cooling device, an additional TEC device, and an additional temperature sensor. In one embodiment, the method also includes operating each of the additional TEC devices and the additional single phase cooling devices based on the additional temperature measured from their respective additional server. In one embodiment, a single fluid pump is used for every single phase cooling device. In one embodiment, if a temperature is detected at any temperature sensor above T2, the single fluid pump is activated.

One skilled in the art would recognize that various adjustments can be made to the system within the scope of this disclosure. The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A thermal management system comprising:
   a liquid cooling unit comprising a cooling plate that includes at least one of an air-cooled heatsink or a liquid loop housing a cooling liquid;
   a condenser;
   a processor located within a server;
   a phase change cooling device having a phase change plate housing a phase change fluid that is in thermal communication with the processor, and in fluid communication with the condenser;
   a single phase cooling device having a flow path housing a single-phase liquid to place the single-phase liquid in thermal communication with the phase change cooling device, and in fluid communication with the liquid cooling unit, wherein the single-phase liquid is thermally coupled to the cooling plate in the liquid cooling unit;
   a temperature sensor in thermal communication with the single phase cooling device; and
   a fluid pump to pump fluid between the liquid cooling unit and the single phase cooling device.

2. The thermal management system of claim 1, wherein the temperature sensor is in communication with the fluid pump such that the fluid pump operates when the temperature sensor has reached a predetermined threshold value.

3. The thermal management system of claim 1, further comprising:
   a thermoelectric cooling (TEC) device located between the phase change cooling device and the single phase cooling device.

4. The thermal management system of claim 3, wherein the phase change cooling device, the TEC device, the temperature sensor, and the single phase cooling device are fabricated as a single package.

5. The thermal management system of claim 3, wherein the temperature sensor is located between the TEC device and the single phase cooling device.

6. The thermal management system of claim 3, further comprising:
   a baseboard management controller (BMC) in communication with the temperature sensor and the TEC device to control power to the TEC device.

7. The thermal management system of claim 6, wherein both the BMC and the fluid pump are in communication with the temperature sensor to selectively activate the TEC and the fluid pump based on a temperature detected by the temperature sensor.

8. The thermal management system of claim 1, further comprising:
   one or more additional servers, each additional server comprising an additional phase change cooling device, an additional single phase cooling device, and an additional temperature sensor.

9. The thermal management system of claim 8, wherein a thermoelectric cooling (TEC) device is arranged between the phase change cooling device and the single phase cooling device, and the TEC device has an electric output that provides DC power to a server printed circuit board (PCB).

10. The thermal management system of claim 8, wherein the single phase cooling device of the server, and each single phase cooling device of the one or more additional servers, share the liquid cooling unit.

* * * * *